(12) United States Patent
Obara et al.

(10) Patent No.: US 7,825,421 B2
(45) Date of Patent: Nov. 2, 2010

(54) SEMICONDUCTOR LIGHT EMITTING DEVICE

(75) Inventors: Kunihiko Obara, Kagoshima (JP);
Mineo Tokunaga, Kagoshima (JP);
Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 740 days.

(21) Appl. No.: 10/571,598

(22) PCT Filed: Sep. 21, 2004

(86) PCT No.: PCT/JP2004/014122

§ 371 (c)(1),
(2), (4) Date: Mar. 10, 2006

(87) PCT Pub. No.: WO2006/006255

PCT Pub. Date: Jan. 19, 2006

(65) Prior Publication Data

US 2007/0001180 A1    Jan. 4, 2007

(30) Foreign Application Priority Data

Sep. 19, 2003  (JP) .............................. 2003-327808

(51) Int. Cl.
*H01L 23/13* (2006.01)
(52) U.S. Cl. ......................................... 257/98; 257/99
(58) Field of Classification Search ............ 257/98–100
See application file for complete search history.

(56) References Cited

U.S. PATENT DOCUMENTS

| 6,707,069 | B2 * | 3/2004 | Song et al. ............... 257/79 |
| 2001/0042858 | A1 * | 11/2001 | Ishinaga .................. 257/13 |
| 2002/0153835 | A1 * | 10/2002 | Fujiwara et al. .......... 313/512 |
| 2004/0173808 | A1 * | 9/2004 | Wu ....................... 257/99 |

FOREIGN PATENT DOCUMENTS

| JP | 63-89251 | 6/1988 |
| JP | 10-223817 | 8/1998 |
| JP | 3257455 | 2/1999 |
| JP | 3399440 | 1/2001 |
| JP | 2001-135861 | 5/2001 |
| JP | 2001-326387 | 11/2001 |
| JP | 2001-326390 | 11/2001 |
| JP | 2002-368279 | 12/2002 |
| JP | 2003-031849 | 1/2003 |
| JP | 2003-218255 | 7/2003 |

* cited by examiner

*Primary Examiner*—Wael M Fahmy
*Assistant Examiner*—Abul Kalam
(74) *Attorney, Agent, or Firm*—Wenderoth, Lind & Ponack, L.L.P.

(57) ABSTRACT

A semiconductor light emitting device comprises an element that emits light and a substrate on a main surface of which the element is mounted. The main surface of the substrate composed of two areas, (i) a mount area which is rectangle and on which the element is mounted, and (ii) a pad area that is equipped with a pad for wire bonding. The pad area is contiguous to the mount area on one side of the mount area, and the pad area decreases in width continuously or stepwise in a direction away from the one side.

14 Claims, 15 Drawing Sheets

320

330

360
↓

370
↓

SEMICONDUCTOR LIGHT EMITTING DEVICE

TECHNICAL FIELD

The present invention relates to a semiconductor light emitting device in which a flip chip semiconductor light emitting element is mounted on a submount substrate, and particularly to a technique for setting a semiconductor light emitting device in a smaller space than the conventional ones.

BACKGROUND ART

In recent years, with an improvement of a technique of semiconductors, semiconductor light emitting devices that output white light to be equipped in lighting apparatuses have become widely used.

Especially, semiconductor light emitting devices are compact and require low electric power. Therefore, semiconductor light emitting devices are suitable for installing in portable devices such as cellular-phones and cameras, and should explosively prevail in the near future.

A semiconductor light emitting device comprises: a semiconductor light emitting element that emits blue light; and translucent resin scatteredly including luminescent substance that converts blue light into greenish yellow light, greenish yellow being a complementary color of blue. The semiconductor light emitting device outputs light that looks white by outputting (a) a part of blue light that is emitted by a semiconductor light emitting element and transmits translucent resin without being converted by the luminescent substance, and (b) greenish yellow light that is generated as a result of conversion by the luminescent substance, at the same time in a proper proportion.

The details about the aforementioned semiconductor light emitting device are disclosed in Japanese Patent Publication No. 3257455 and No. 3399440 filled by the applicants of the present invention.

The aforementioned semiconductor light emitting device comprises a submount substrate and a flip chip semiconductor light emitting element that is mounted on the submount substrate, and needs a space for wire bonding on the submount substrate. Therefore, the submount substrate needs to be larger than the semiconductor light emitting element, and the semiconductor light emitting element is mounted on the submount substrate in an unbalanced position where a center of the semiconductor light emitting element does not coincide with a center of the submount substrate. It should be noted here that generally a main surface of the semiconductor light emitting element is substantially square and a main surface of the submount substrate is substantially rectangular.

Also, it is preferable that the semiconductor light emitting device is equipped with a cup-like reflection member to reflect the light emitted in parallel with a main light emitting surface by the semiconductor light emitting element so that the light travels in a direction perpendicular to a main light emitting surface.

The reflection member is a metal plate that has a conical-trapezoidal-shaped hole, as one example. On a bottom of the reflection member, the semiconductor light emitting element is provided. Radius of the reflection member decreases from a top toward a bottom.

Also a lens made of transparent resin or the like is provided over the reflection member to improve light distribution characteristic, and it is preferable to keep a radius on a bottom as small as possible taking the amount of materials and light focusing efficiency into account.

However, taking a light distribution characteristic into consideration, if a center of main light emitting surface of the semiconductor light emitting element is adjusted to coincide with a center of the reflection member, a space for wire bonding sticks out from the main light emitting surface. This would make a radius on a bottom of the reflection member considerably larger than a shape of the submount substrate. Nonetheless, adjusting a center of the submount substrate to coincide with a center of the reflection member should be avoided because it causes a degradation of light distribution characteristic. Also, reducing a space for wire bonding should be avoided because it increases bonding defects, lowers a yield ratio, and diminishes productivity due to an effort to improve accuracy.

The aim of the present invention is to provide a semiconductor light emitting device that can be set in a smaller space than the conventional ones without sacrificing light distribution characteristic and productivity and to provide a method for manufacturing the semiconductor light emitting device.

DISCLOSURE OF THE INVENTION

The semiconductor light emitting device of the present invention comprises an element to emit light and a substrate on a main surface of which the element is mounted. The main surface of the substrate composed of two areas, (i) a mount area which is rectangular and on which the element is mounted, and (ii) a pad area that is equipped with a pad for wire bonding. Here, the pad area is contiguous to the mount area on one side of the mount area, and the pad area decreases in width continuously or stepwise in a direction away from the one side.

With this structure, a width of the pad area decreases with the distance from the element. This enables to keep a space for wire bonding without being inferior to the prior art, and to decrease a radius of a bottom of a cup-like reflection member with attention to light distribution characteristic by adjusting a center of a main light emitting surface of the element to coincide with a center of the reflection member. Therefore, it is possible to reduce the amount of materials and to improve light focusing efficiency.

Also, this structure has only two areas, the mount area and the pad area, on the main surface of the substrate. In other words, there is no wasted space on the substrate. This allows greater flexibility to cut off substrates from an array substrate such as a silicon wafer and to increase the number of substrates that can be cut off from an array substrate, compared with circular or polygonal substrates (a hexagon substrate, for one example) on which an element needs to be mounted in a middle.

Consequently, according to the present invention, it is possible to set a semiconductor light emitting element in a smaller space than the conventional ones without sacrificing light distribution characteristic and productivity.

A shape of the pad area of the semiconductor light emitting device can be an isosceles trapezoid whose long base coincides with the one side.

With this arrangement, since the pad area is an isosceles trapezoid, it is possible to make the pad area easily just by cutting off diagonally two corners of the conventional rectangle pad area.

Also, a shape of the pad area of the semiconductor light emitting device can be an isosceles triangle whose base coincides with the one side.

With this arrangement, since the pad area is an isosceles triangle, it is possible to make the pad area easily just by cutting off diagonally two corners of the conventional rectangle pad area.

Also, a shape of the pad area of the semiconductor light emitting device can be a circular arc whose chord coincides with the one side.

With this arrangement, since the pad area is a circular arc, it is possible to set the semiconductor light emitting device along a form of a reflection member, and to keep a space for wire bonding. Therefore, it is possible to further reduce a radius on a bottom of a reflection member.

Also, a shape of the pad area of the semiconductor light emitting device can be a half regular polygon obtained by dividing a regular polygon by a symmetrical line, and a longest side of the half regular polygon coincides with the one side.

With this arrangement, since the pad area is a half regular polygon, it is possible to make the pad area just by cutting off as many sides of the pad area as needed. The larger the number of sides of the polygon is, the larger a space for wire bonding is. Thus, it is possible to further reduce a radius of a bottom of a reflection member where the semiconductor light emitting device is provided.

Further, the semiconductor light emitting device may comprises a phosphor to change a wavelength of the light emitted by the element. The element can be mounted substantially in the center of the mount area, and the mount area can be covered entirely together with the element, by the phosphor.

With this arrangement, since the mount area is covered entirely by the phosphor, it is possible to cut the phosphor in a horizontal direction along with three sides of the substrate when cutting off substrates from an array substrate by dicing. Therefore, it is possible to diminish deviation in thicknesses of the phosphor without increasing a manufacturing process, and to diminish deviation in colors and partial discoloration.

Also, in the semiconductor light emitting device, an electrode that is included in the element and is connected to the pad can be positioned substantially in the center of one of two sides of the mount area that is connected to the one side.

With this arrangement, in the pattern where the substrates are arranged to face respectively right and left to increase the number of substrates that can be cut off from an array substrate, it is possible to bond the elements while they face the same direction when bonding the elements on an array substrate by die bonding. Therefore, a mechanism to turn elements needs not to be equipped in a die bonding machine.

Also the semiconductor light emitting device may further comprises a cup-like reflection member to reflect the light that is emitted in parallel with the main surface by the element so that the light travels in a direction perpendicular to the main surface, and a center of a main light emitting surface of the element coincides with a center of the reflection member.

With this arrangement, the reflection member enables to reflect the light emitted in parallel with a main light emitting surface by the element so that the light travels in a direction perpendicular to the main surface. Therefore, it is possible to improve luminous efficiency. Further, light distribution characteristic is improved and luminous unevenness can be diminished by adjusting a center of a main light emitting surface of the element to coincide with a center of the reflection member.

Also, the semiconductor light emitting device may further comprise a lens to output the light emitted by the element toward an object. Here, a center of the main light emitting surface of the element coincides with an optical center of the lens.

With this arrangement, the lens enables to output the light emitted by the element toward an object. Therefore, it is possible to improve light distribution characteristic and light directional characteristic. Further, a light distribution characteristic is improved and luminous unevenness can be diminished by adjusting a center of a main light emitting surface of the element to coincide with an optical center of the lens.

The method for manufacturing the semiconductor light emitting device of the present invention comprises (a) an array substrate generating step for generating an array substrate of substrates arranged in a unique arrangement pattern, (b) a die bonding step for bonding elements respectively on the substrates arranged in the array substrate by die bonding, and (c) a cutting step for cutting the array substrate into individual semiconductor light emitting devices by dicing. Here, in the arrangement pattern mentioned above, a side of the mount area that is opposite to the one side is adjoined by a side of another mount area for another element, with two elements on the mount area and said the another mount area adjoining back to back.

With this arrangement, it is possible to increase the number of substrates that can be cut off from an array substrate.

The method for manufacturing the semiconductor light emitting device may further include an applying step, between the die bonding step and the dicing step, for applying the phosphor to the elements in a unique application pattern. Here, in the application pattern, the phosphor is applied collectively to the two elements that are adjoining back to back centering on the adjoining sides.

With this arrangement, it is possible to apply the phosphor collectively to the elements adjoined back to back. Therefore, manufacturing efficiency is improved.

Also, the phosphor can be cut off at the same time when cutting off substrates from an array substrate by dicing. Therefore, it is possible to diminish deviation in thicknesses of the phosphor without increasing a manufacturing process.

Also, in the die bonding step of the method for manufacturing the semiconductor light emitting device, an electrode that is included in the element and is connected to the pad can be positioned substantially in the center of one of two sides of the mount area that is connected to the one side, and such that all of the elements face the same direction.

With this arrangement, it is possible to bond the elements while they face the same direction when bonding the elements on the array substrate by die bonding. Therefore, a mechanism to turn elements needs not to be equipped in a die bonding machine.

The method for manufacturing the semiconductor light emitting device of the present invention may includes (a) an array substrate generating step for generating an array substrate of substrates arranged in a unique arrangement pattern, (b) a mount step for mounting the elements respectively on the substrates in the array substrate, and (c) a cutting step for cutting the array substrate into individual semiconductor light emitting devices by dicing. Here, in the arrangement pattern, (i) even number rows in which substrates that each have a mount area on the left and a pad area on the right are connected with each other in a left-right direction and (ii) odd number rows in which substrates that each have a mount area on the right and a pad area on the left are connected with each other in left-right direction, may be aligned alternately.

With this arrangement, it is possible to increase the number of substrates that can be cut off from an array substrate.

The method for manufacturing the semiconductor light emitting device may further include an applying step, between the die bonding step and the cutting step, for applying the phosphor to the elements in a unique application pattern. Here, in the arrangement pattern, there are margins between two elements adjoining in rows, and in the application pattern, deviation of an application width is controlled by the margins.

With this arrangement, it is possible to improve productivity because the margins enable to control deviation of an application width.

Also, in the die bonding step of the method for manufacturing the semiconductor light emitting device, an electrode that is included in the element and is connected to the pad can be positioned substantially in the center of one of two sides that is connected to the one side, and such that all of the semiconductor light emitting elements face the same direction.

With this arrangement, it is possible to bond the elements while they face the same direction when bonding the elements on substrates by die bonding, therefore, a mechanism to turn elements needs not to be equipped in a die bonding machine.

BRIEF DESCRIPTION OF THE DRAWING

FIG. 2 shows the light emitting module 20 without a lens viewed at a point where the light is received therefrom. FIG. 2B is a cross sectional view of the light emitting module 20 taken along the line A-A'.

BEST MODE FOR CARRYING OUT THE INVENTION

First Embodiment

<General Description>

The inventors of the present application focused attention on a point that corners of a space for wire bonding on conventional rectangular substrates do not function efficiently as a pad for wire bonding, in spite that the corners are one of the factors that affect a minimum size of cup-like reflection members and lenses. This embodiment provides a semiconductor light emitting device in which corners of a space for wire bonding are improved in shape. The semiconductor light emitting device of the present invention can be set in a smaller space than conventional ones without sacrificing light distribution characteristic and productivity. Also, the semiconductor light emitting device of the present invention enables to reduce the amount of materials and to improve light focusing efficiency.

<Structure>

Figure 1:
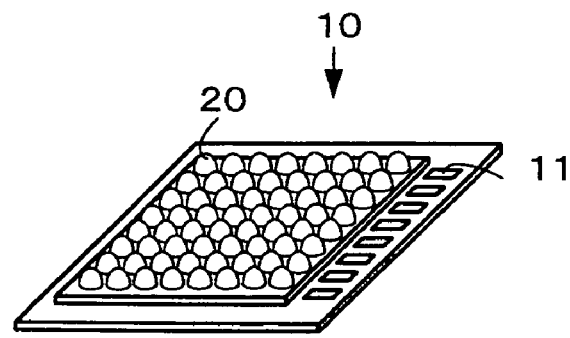
FIG. 1 shows an appearance of a lighting device 10 that comprises a number of light emitting modules respectively including semiconductor light emitting devices of the first embodiment.

FIG. 1 shows an appearance of a lighting device 10 that comprises a number of light emitting modules respectively including semiconductor light emitting devices of the first embodiment.

As shown in FIG. 1, the lighting device 10 of the first embodiment is a light emitting panel that outputs white light to be used for illuminations, and comprises eight terminals 11 to receive an electric supply and sixty-four light emitting modules 20 that are arranged in an eight-by-eight matrix. The lighting device 10 outputs white light by connecting the outer terminals 11 to a power source and making each of the light emitting module 20 emit light.

Figure 2A:
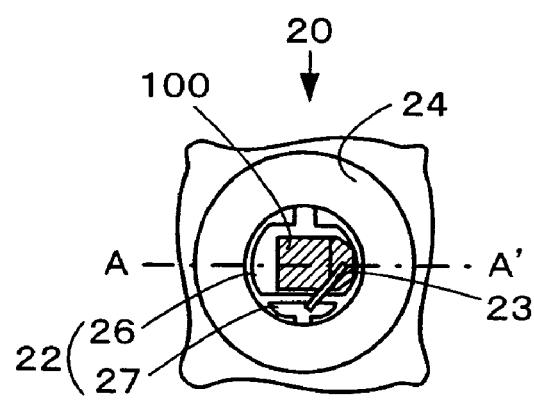
FIG. 2A and 2B show details of the light emitting module 20 of FIG. 1.
Figure 2B:
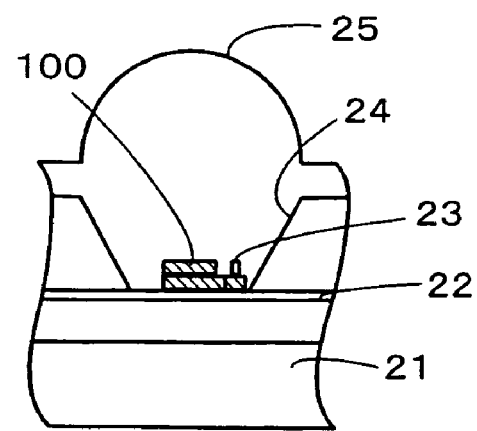

FIGS. 2A and 2B show details of the light emitting module 20 of FIG. 1. FIG. 2A shows the light emitting module 20 without a lens viewed at a point where the light is received therefrom. FIG. 2B is a cross sectional view of the light emitting module 20 taken along the line A-A'.

As shown in FIG. 2A and FIG. 2B, the light emitting module 20 comprises a device substrate 21, a wiring pattern 22, a bonding wire 23, a reflecting unit 24, a lens unit 25, and a semiconductor light emitting device 100. Here, the semiconductor light emitting device 100 is indicated by a shaded part.

The device substrate 21 is a board made of aluminum-based alloy, for example. It is preferable that the device substrate 21 is made of a material that is able to maintain a rigidity of the lighting device 10, and has a high heat conductance to efficiently discharge heat generated by the semiconductor light emitting device 100.

The wiring pattern 22 is metal foil such as copper foil formed on a main surface of the device substrate 21. The wiring pattern 22 includes (a) a first electrode 26 that is positioned at least in a part on which the semiconductor light emitting device 100 is to be bonded by die bonding and is electrically connected to one of the outer terminals 11 and (b) a second electrode 27 that is positioned at least in a part where the bonding wire 23 is to be bonded by wire bonding and is electrically connected to another one of the outer terminals 11. It should be noted here that the first electrode 26 and the second electrode 27 are arranged to be slightly widened to reflect upward the light that comes downward.

The bonding wire 23 is an electric conductor made of, for example, gold or aluminum, and connects a bonding pad on the semiconductor light emitting device 100 and the second electrode 27.

The reflecting unit 24 is made by boring holes that are circular in a cross section in a metal plate made of, for example, aluminum. The holes are bored to fit each of the light emitting module 20, and radii of the holes increase as the distance from a bottom where the semiconductor light emitting element is provided increases. The reflecting unit 24 also can be made by providing conical-trapezoidal cup-like reflection members on a metal plate, radii of reflection members decreasing toward a bottom. The reflection members are provided to fit each of the light emitting module 20. The reflecting unit 24 is equipped to reflect the light that is emitted in parallel with a main light emitting surface by the semiconductor light emitting device 100 so that the light travels in a direction perpendicular to the main light emitting surface. Also, by adjusting a center of a main light emitting surface of the semiconductor light emitting device 100 to coincide with a center of the reflecting unit 24, light distribution characteristic is improved and luminous unevenness is diminished.

The lens unit 25 is made of resin such as epoxy resin and is formed according to a transfer forming method. The lens unit 25 is used to output light emitted by the semiconductor light emitting device 100 toward an object. It is preferable to restrict the use of filler to improve light transmission of epoxy resin. Therefore, highly-purified epoxy resin with no filler is used for the lens unit 25. Also, by adjusting a center of a main light emitting surface of the semiconductor light emitting device 100 to coincide with an optical center of the lens unit 25, light distribution characteristic is improved and luminous unevenness is diminished.

Figure 3A:
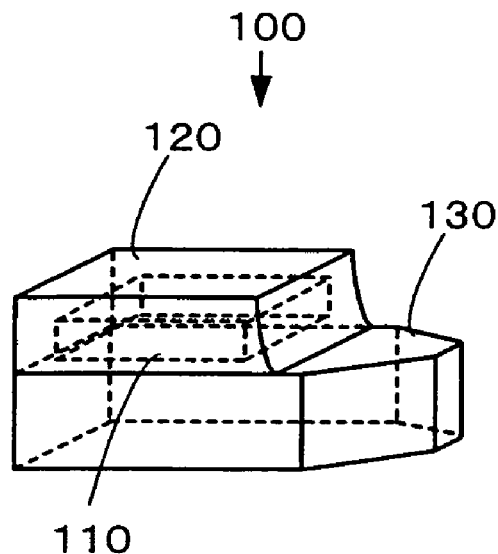
FIG. 3A shows an appearance of the semiconductor light emitting device 100 described in the first embodiment.

FIG. 3A shows an appearance of the semiconductor light emitting device 100 described in the first embodiment.

Figure 3B:
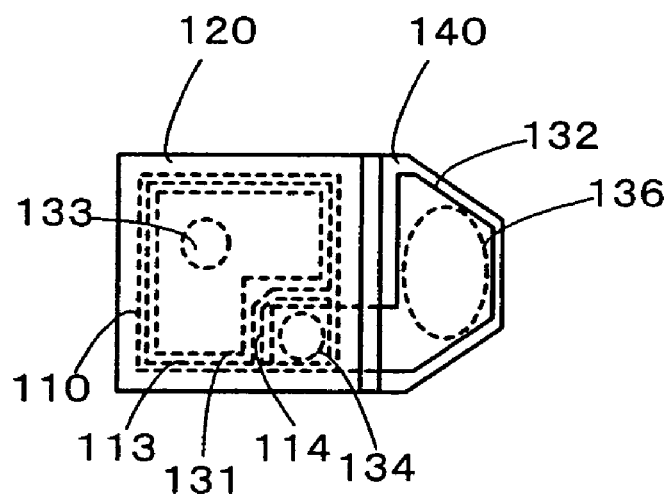
FIG. 3B shows the semiconductor light emitting device 100 of FIG. 3A viewed at a point where the light is received therefrom.

FIG. 3B shows the semiconductor light emitting device 100 of FIG. 3A viewed at a point where the light is received therefrom.

Figure 3C:
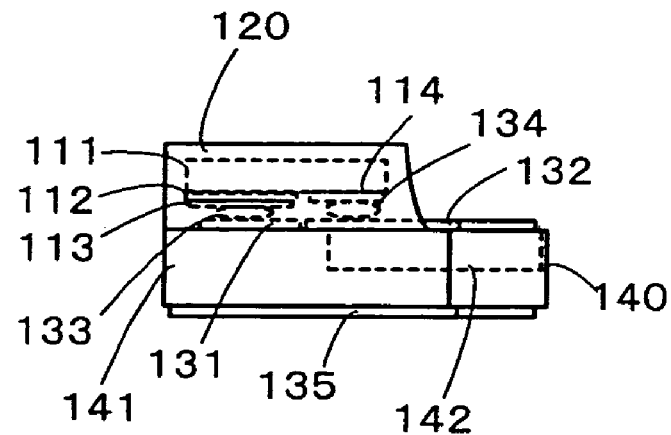
FIG. 3C is a front view of the semiconductor light emitting device 100 of FIG. 3B.

FIG. 3C is a front view of the semiconductor light emitting device 100 of FIG. 3B.

As shown in FIG. 3A, FIG. 3B, and FIG. 3C, the semiconductor light emitting device 100 is a device to output white light, and comprises a semiconductor light emitting element 110, a translucent resin 120, and a submount substrate 130.

The semiconductor light emitting element 110 is an element to emit light whose main surface is rectangular, such as a light emitting diode that comprises a substrate having an optical transparency on which a GaN chemical compound semiconductor layer is formed and emits blue light. The semiconductor light emitting element 110 comprises a sapphire substrate 111 that has translucency, a semiconductor layer 112 comprising an n type light emitting layer and a p type light emitting layer, a p electrode 113 that is connected to the p type light emitting layer, and an n electrode 114 that is connected to the n type light emitting layer. The semiconductor light emitting element 110 has the p electrode 113 and the n electrode 114 on the main surface facing the submount substrate 130, and the other main surface is a main light emitting surface that chiefly emits light. Here, the semiconductor light emitting element 110 is a rectangular parallelepiped whose main surface being 3 mm square and thickness being 0.1 mm, and is mounted on the submount substrate 130 as shown in FIG. 3.

The translucent resin 120 scatteredly includes luminescent substance (not shown in drawings) that converts blue light into greenish yellow light, greenish yellow being a complementary color of blue. The translucent resin 120 is a translucent phosphor made of a resin material that transmits (a) blue light which has not been converted to greenish yellow light by the luminescent substance and (b) greenish yellow light which has been generated as a result of conversion by the luminescent substance. The translucent resin 120 is mounted on the submount substance 130 as shown in FIG. 3 to cover the submount substrate 130 and its surrounding area.

The submount substrate 130 includes a silicon substrate 140 that is a protective diode such as a zener diode made of basically silicon. The submount substrate 130 is a substrate on which the semiconductor light emitting element 110 and the translucent resin 120 are mounted, and has a first counter electrode 131, a second counter electrode 132, and bump electrodes 133 and 134 on a mount surface that is a main surface of the silicon substrate 140 and has the semiconductor light emitting element 110 and the translucent resin 120 thereon. Also, a back-side electrode 135 is provided on a main surface of the silicon substrate 140 opposite to the mount surface.

The silicon substrate 140 comprises (a) an n type semiconductor area 141 adjoining the first counter electrode 131 and (b) a p type semiconductor area 142 adjoining the second counter electrode 132. Also, at least the counter electrode 132 is provided on a part of the mount surface that is not covered by the translucent resin 120, and this part is to be a bonding pad 136 to be used for wire bonding.

The following explains a shape of the main surface of the submount substrate 130. The main surface of the submount substrate 130 is slightly larger than a main surface of the semiconductor light emitting element 110, and composed of two areas, (i) a mount area which is a rectangle and on which the semiconductor light emitting element 110 and the translucent resin 120 are mounted and (ii) a pad area that is equipped with the bonding pad 136. Here, the pad area is contiguous to the mount area on one side of the mount area, and the pad area decreases in width continuously or stepwise in a direction from the one side.

Here, the main surface of the submount substrate 130 comprises a rectangular mount area whose short sides being 0.4 mm and long sides being 0.42 mm, and an isosceles trapezoidal pad area whose long base being 0.4 mm, short base being 0.12 mm, and a height being 0.14 mm. The short side of the mount area is contiguous to the long base of the pad area, and a thickness is 0.2 mm. It should be noted here that the long base of the pad area denotes a longer side of parallel sides of an isosceles trapezoid.

Also, various diodes such as a zener diode, a pn diode, a pin diode, a shottky barrier diode, a tunnel diode, and a gun diode can be used as the silicon substrate 140.

Here, the silicon substrate 140 that is a protective diode is connected with the semiconductor light emitting element 110 that is a light emitting diode, by electrodes that have reversed polarities. With such an arrangement in which a protective diode is connected with a light emitting diode, even if an attempt is made to apply a reverse voltage to the light emitting diode, a reverse voltage is hardly applied to the light emitting diode because electric current flows forward to the protective diode. Also, even if an attempt is made to apply an excessive forward voltage to the light emitting diode, a higher voltage than a reverse breakdown voltage (a zener voltage) of the protective diode is not applied. In a case where a silicon diode is used as the protective diode, usually a forward voltage can be set at approximately 0.9 V, a reverse breakdown voltage at approximately 10 V. On the other hand, a forward breakdown voltage of a GaN light emitting diode is approximately 100 V, and a reverse breakdown voltage is approximately 30 V. Therefore, it is possible to assuredly prevent a light emitting diode from being destroyed by an excessive voltage due to static electricity and such.

A light emitting diode that emits blue light is mainly GaN-based, and has less resistance to static electricity compared with other bulk chemical compound semiconductors GaP-based or GaAlAs-based. Therefore, the arrangement in which various diodes are used in the submount substrate 130 produces great effect. However, the submount substrate 130 may not necessarily be composed of diodes in cases where other measures are taken against static electricity or where a semiconductor light emitting element such as other bulk chemical compound semiconductors that has high resistance to static electricity is used.

The first counter electrode 131 is electrically connected to the p electrode 113 equipped on the semiconductor light emitting element 110, by the bump electrode 133, and the second counter electrode 132 is electrically connected to the n electrode 114 equipped on the semiconductor light emitting element 110, by the bump electrode 134. When a voltage is applied between the first counter electrode 131 and the second counter electrode 132, the light emitting element 110 emits light.

It should be noted here that the light emitting element 110 is not limited to an element that emits blue light. An element that emits ultraviolet light can be the light emitting element 110 as an example. In this case, a translucent resin 120 includes luminescent substance that excites the ultraviolet light emitted by the semiconductor light emitting element 110 to emit blue light, red light and green light, and is a translucent phosphor comprising resin material that transmits the blue light, the red light, and the green light which is generated by the luminescent substance.

<Method for Manufacture>

Figure 4:
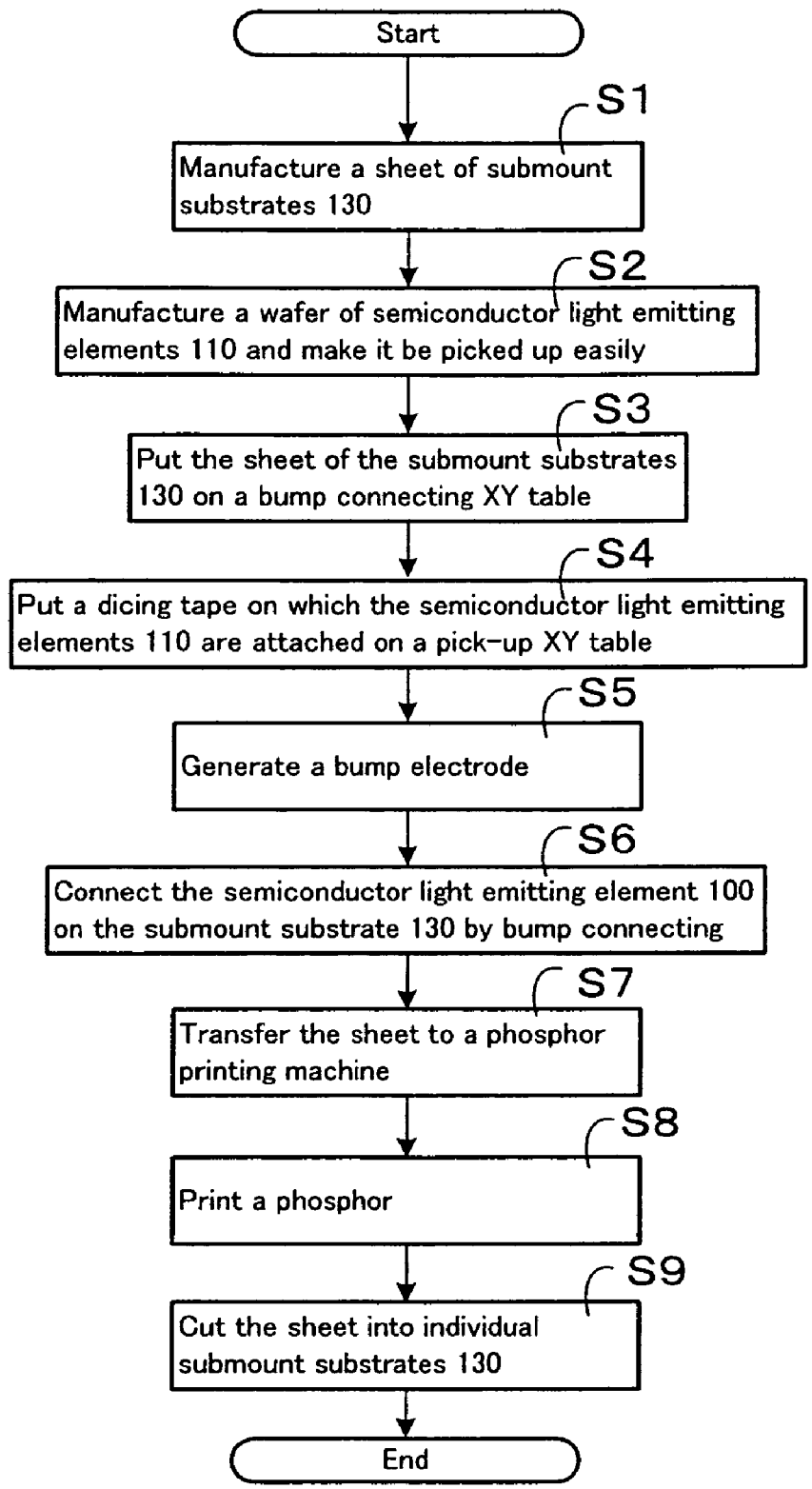
FIG. 4 is a schematic diagram showing a method for manufacturing the semiconductor light emitting device 100 of the first embodiment.

FIG. 4 is a schematic diagram showing a method for manufacturing the semiconductor light emitting device 100 of the first embodiment.

The following describes a method for manufacturing the semiconductor light emitting device 100 with reference to FIG. 4.

(1) A sheet of the submount substrates 130 (an array substrate) is manufactured by manufacturing a wafer of the silicon substrate 140 which is a zener diode made of basically silicon and by equipping the wafer with the first counter electrodes 131, the second counter electrodes 132 and the back-side electrode 135 (Step S1). Here, the present method differs from the conventional method in that it uses a unique arrangement pattern.

Figure 5:
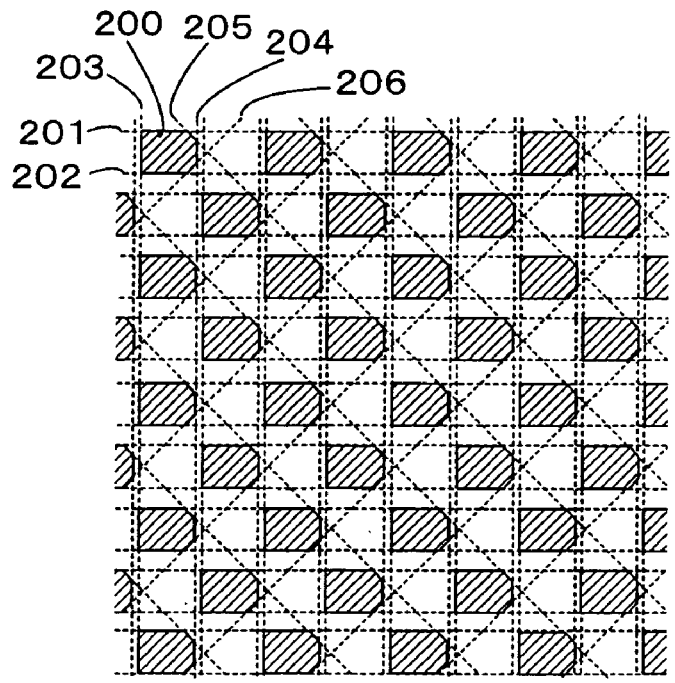
FIG. 5 shows one example of the arrangement patterns unique to the present invention.

FIG. 5 shows one example of the arrangement patterns unique to the present invention.

In FIG. 5, the submount substrates 130 are indicated by shaded parts, and each broken line indicates positions to be cut by dicing. When cutting off a shaded part 200 at the upper left, for example, it is preferable to cut it along the broken lines in the ascending order of the reference numbers, from 201 to 206, because chipping can be prevented by cutting longer side first.

(2) A wafer of the semiconductor light emitting elements 110 is manufactured and attached onto a dicing tape. Then after being divided into chips by dicing, the wafer is expanded together with the dicing tape so that each chip of the semiconductor light emitting element 110 can be picked up easily (Step S2).

(3) The sheet of the submount substrates 130 is put in place on a XY table for bump connecting based on the shape and an alignment mark on the sheet (Step S3).

(4) The dicing tape on which the semiconductor light emitting elements 110 are attached is put in a place on a XY table for picking up substrates (Step 4).

(5) Bump electrodes 133 and 134 are generated at each position on the submount substrates 130 where the semiconductor light emitting element 110 is to be connected by bump connecting (Step s5).

(6) The semiconductor light emitting elements 110 are picked up one by one from the dicing tape by moving the XY table for bump connecting. On a midway stage, accuracies of directions and positions are improved, and the semiconductor light emitting elements 110 are connected to each of the submount substrate 130 by bump connecting (Step S6).

(7) After the semiconductor light emitting elements 110 are respectively connected to all of the submount substrates 130 on the sheet, the sheet is transferred to a phosphor printer employing a metal plate (Step 7).

Figure 6:
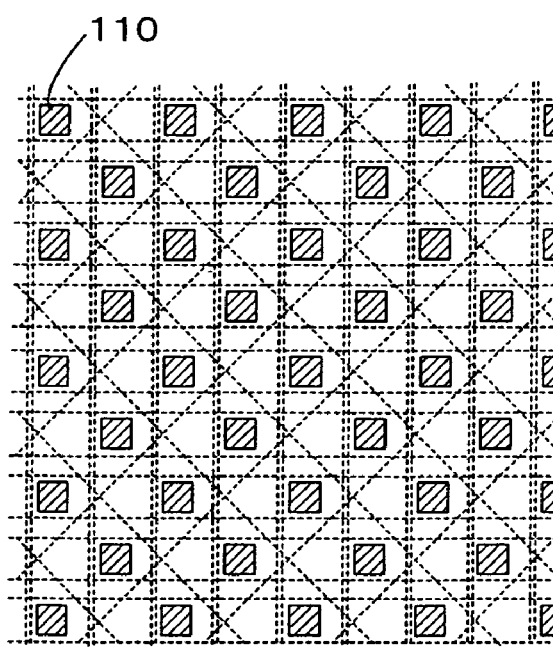
FIG. 6 shows one example of the sheets of the submount substrates 130 on which all of the semiconductor light emitting elements 110 are connected by bump connecting.

FIG. 6 shows one example of a sheet of the submount substrates 130 on which all of the semiconductor light emitting elements 110 are connected by bump connecting.

In FIG. 6, the semiconductor light emitting elements 110 are indicated by shaded parts, and each of the broken line indicates positions to be cut by dicing.

(8) In the phosphor printing press, a phosphor is applied/printed on the semiconductor light emitting elements 110 and their surroundings in a unique application pattern (Step S8).

Figure 7:
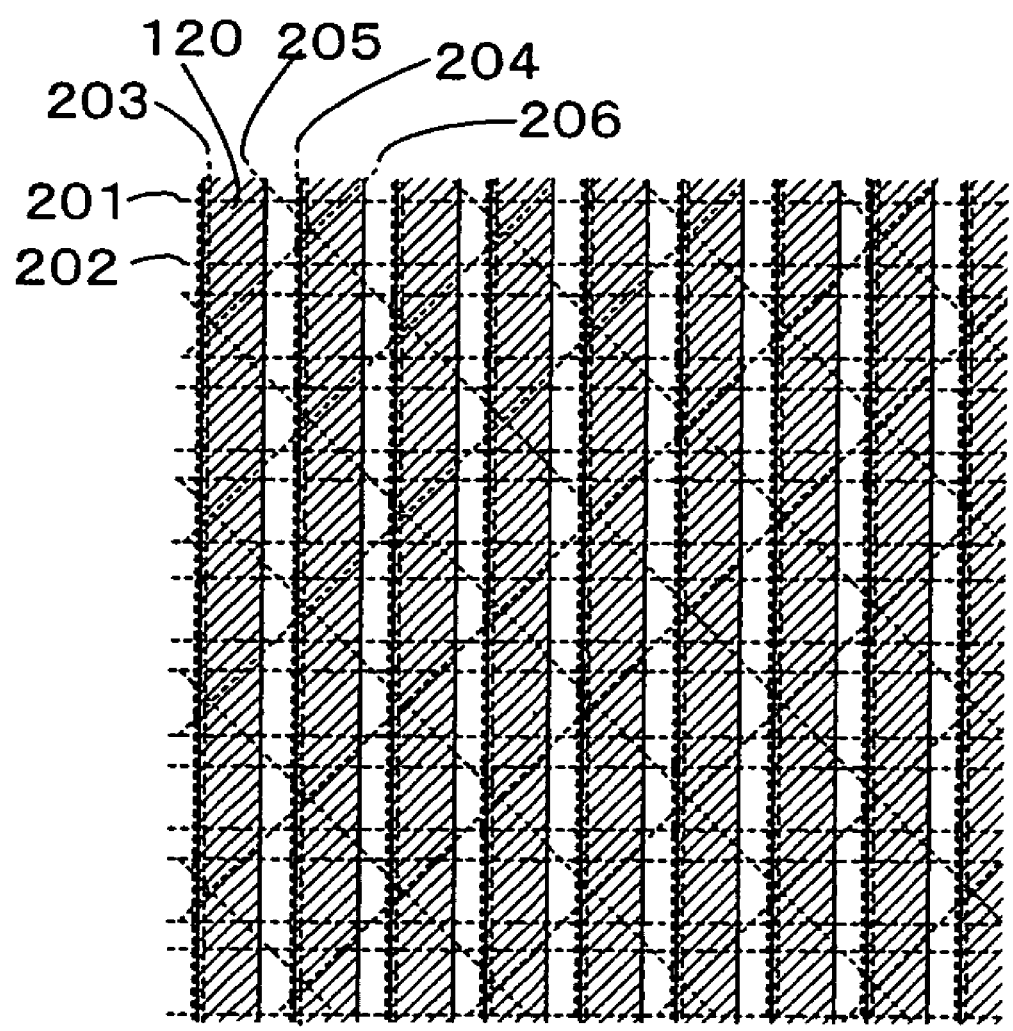
FIG. 7 shows one example of the sheets of the submount substrates 130 on which a phosphor is applied/printed in a unique application pattern.

FIG. 7 shows one example of the sheets of the submount substrates 130 on which the phosphor is applied/printed in a unique application pattern.

In FIG. 7, the phosphors applied/printed on the sheet are indicated by shaded parts, and broken lines indicate positions to be cut by dicing.

(9) The semiconductor light emitting device 100 is completed after the sheet is divided into each submount substrate 130 by dicing (Step 9).

Here, when the submount substrates 130 are cut off from the sheet by dicing, margins between elements that are adjacent in the row and column directions are cut off along three sides of the phosphor. Therefore, with an application pattern unique to the present invention, it is easy to control deviation of an application width. For example, in FIG. 7, a translucent resin 120 at the upper left is formed by cutting along three sides of the phosphor that are shown by broken lines 201, 202, and 203.

<Summary>

As described above, according to the semiconductor light emitting device of the first embodiment, corners of a wire bonding area of the rectangular submount substrates are improved in shape, and it is possible to reduce the minimum size of reflection members and lenses.

Consequently, it is possible to set in a smaller space, to reduce the amount of materials, and to improve light focusing efficiency without sacrificing light distribution characteristic and productivity as compared with conventional light emitting devices.

MODIFICATION EXAMPLE 1

The modification example 1 of the present invention shows a modification of a shape of the pad area described in the first embodiment.

The shape of the pad area is not limited to isosceles trapezoidal described in the first embodiment. The pad area can be other trapezoids, isosceles triangles, other triangles, circular arcs, and half regular polygons.

Figure 8A:
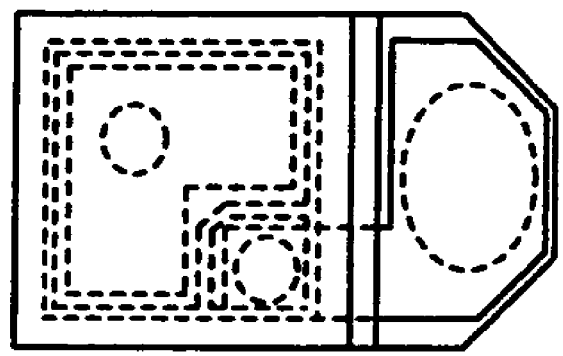
FIG. 8A and FIG. 8B show semiconductor light emitting devices whose pad areas are trapezoids viewed at a point where the light is received therefrom. In a semiconductor light emitting device 300 shown in FIG. 8A, the mount area has an extended long side. In a semiconductor light emitting device 310 shown in FIG. 8B, the mount area has a not-remarkably-extended long side.
Figure 8B:
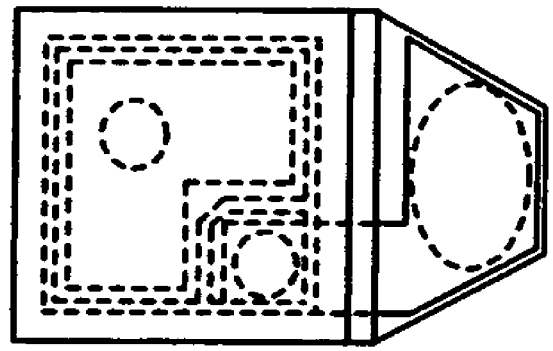

FIG. 8A and FIG. 8B show semiconductor light emitting devices whose pad areas are trapezoids viewed at a point where the light is received therefrom. In a semiconductor light emitting device 300 shown in FIG. 8A, the mount area has an extended long side. In a semiconductor light emitting device 310 shown in FIG. 8B, the mount area has a not-remarkably-extended long side.

In the semiconductor light emitting devices 300 and 310, the long base of the isosceles trapezoid coincides with a short side of the mount area.

Figure 9A:
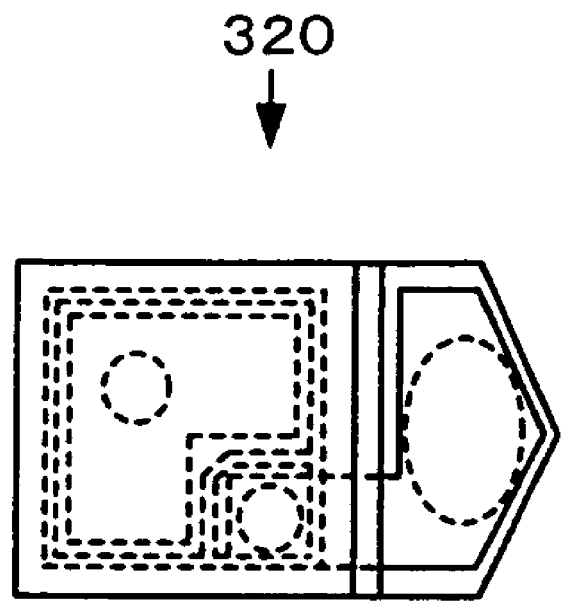
FIG. 9A and FIG. 9B show semiconductor light emitting devices whose pad areas are triangles viewed at a point where the light is received therefrom. In a semiconductor light emitting device 320 shown in FIG. 9A, the mount area has an extended long side. In a semiconductor light emitting device 330 shown in FIG. 9B, the mount area has a not-remarkably-extended long side.
Figure 9B:
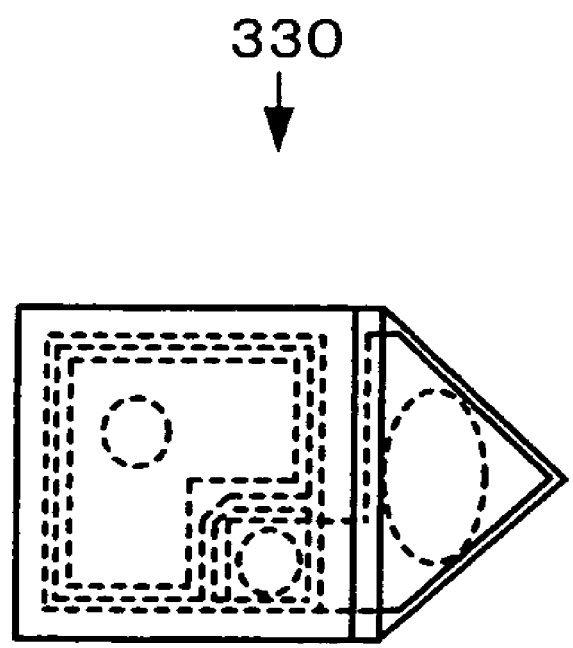

FIG. 9A and FIG. 9B show semiconductor light emitting devices whose pad areas are triangles viewed at a point where the light is received therefrom. In a semiconductor light emitting device 320 shown in FIG. 9A, the mount area has an extended long side. In a semiconductor light emitting device 330 shown in FIG. 9B, the mount area has a not-remarkably-extended long side.

In the semiconductor light emitting devices 320 and 330, a base of the isosceles triangle coincides with a short side of the mount area.

Figure 10A:
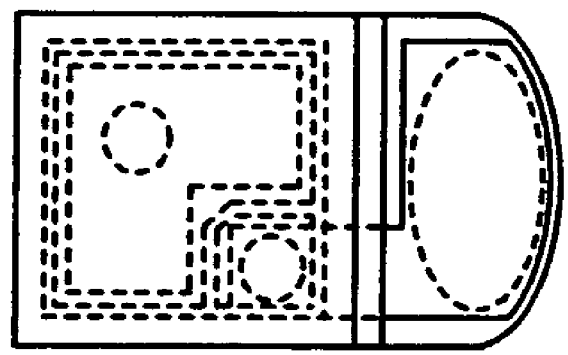
FIG. 10A and FIG. 10B show light emitting devices whose pad areas are circular arcs viewed at a point where the light is received therefrom. In a semiconductor light emitting device 340 shown in FIG. 10A, the mount area has an extended long side. In a semiconductor light emitting device 350 shown in FIG. 10B, the mount area has a not-remarkably-extended long side.
Figure 10B:
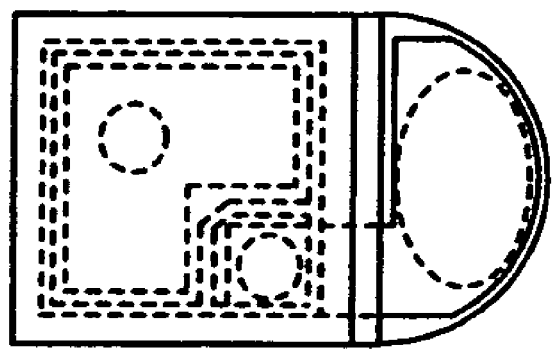

FIG. 10A and FIG. 10B show light emitting devices whose pad areas are circular arcs viewed at a point where the light is received therefrom. In a semiconductor light emitting device 340 shown in FIG. 10A, the mount area has an extended long side. In a semiconductor light emitting device 350 shown in FIG. 10B, the mount area has a not-remarkably-extended long side.

In the semiconductor light emitting devices 340 and 350, a chord of the circular arc coincides with a short side of the mount area.

Figure 11A:
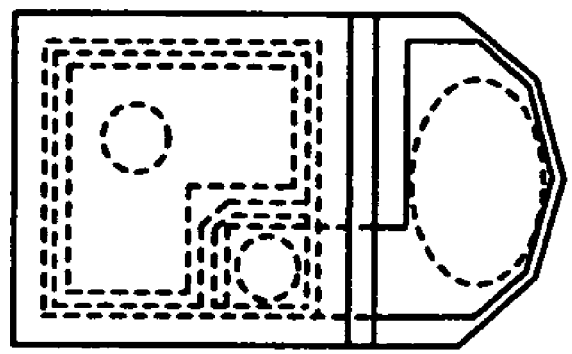
FIG. 11A and FIG. 11B show semiconductor light emitting devices whose pad areas are half regular polygons (Octagon is used in the drawing) viewed at a point where the light is received therefrom. In a semiconductor light emitting device 360 shown in FIG. 10A, the mount area has an extended long side. In a semiconductor light emitting device 370 shown in FIG. 10B, the mount area has a not-remarkably-extended long side.
Figure 11B:
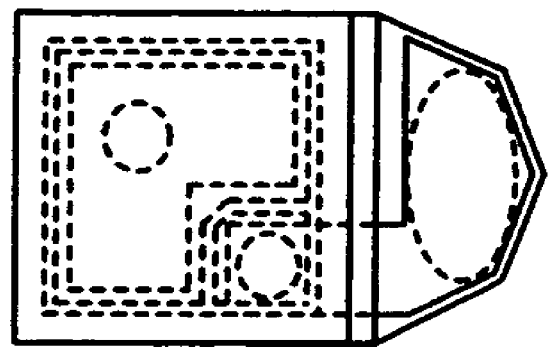

FIG. 11A and FIG. 11B show semiconductor light emitting devices whose pad areas are half regular polygons (Octagon is used in the drawing) viewed at a point where the light is received therefrom. In a semiconductor light emitting device 360 shown in FIG. 10A, the mount area has an extended long side. In a semiconductor light emitting device 370 shown in FIG. 10B, the mount area has a not-remarkably-extended long side.

In the semiconductor light emitting devices 360 and 370 shown in FIG. 11A and FIG. 11B, a longest side of the half regular polygon coincides with a short side of the mount area.

Here, in the semiconductor light emitting devices 300, 320, 340 and 360, long sides of mount areas are extended. Therefore, it is easy to apply/print a translucent resin.

In the semiconductor light emitting devices 300 and 310, it is possible to have a large space between a wire and the submount substrate. Therefore, credibility is high. Also, the semiconductor light emitting devices 300 and 310 can be simply made just by cutting off diagonally two corners of the conventional rectangular pad area.

In the semiconductor light emitting devices 320 and 330, it is possible to reduce a radius of a bottom of the reflection member. Therefore, reflection efficiency is improved. The semiconductor light emitting devices 320 and 330 can be simply made just by cutting off diagonally two corners of the conventional rectangular mount area. Further, the semiconductor light emitting device 330 has a large wire bonding area and exhibits high bond quality.

The semiconductor light emitting devices 340 and 350 can be set substantially along a form of the reflection member. Also it is possible to keep a space for wire bonding and to reduce radius of a bottom of a reflection member where the semiconductor light emitting device is provided.

Further, the semiconductor light emitting devices 360 and 370 can be made just by cutting off as many sides of the pad areas as needed, and the larger the number of sides of the polygons are, the larger spaces for wire bonding are. Thus, it is possible to further reduce a radius of a bottom of a reflection member where the semiconductor light emitting device is provided.

MODIFICATION EXAMPLE 2

The modification example 2 shows one example of arrangement patterns unique to the present invention in a case where the pad area is a triangle.

Figure 12:
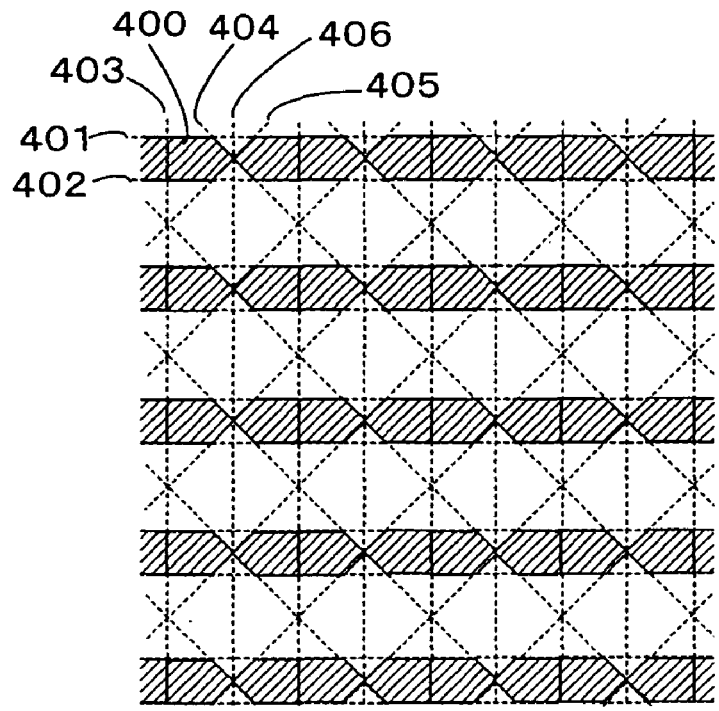
FIG. 12 shows one example of the arrangement patterns unique to the present invention.

FIG. 12 shows one example of arrangement patterns unique to the present invention.

In FIG. 12, shaded parts indicate the submount substrates whose pad areas are triangles, and each broken line indicates positions to be cut by dicing. When cutting off a shaded part 400 at the upper left, for example, it is preferable to cut it along the broken lines in the ascending order of the reference numbers, from 401 to 405, because chipping can be prevented by cutting the longer sides first.

Also, in FIG. 12, it is possible to make the pad area trapezoidal by cutting along the broken line 406 with a thick blade.

Figure 13:
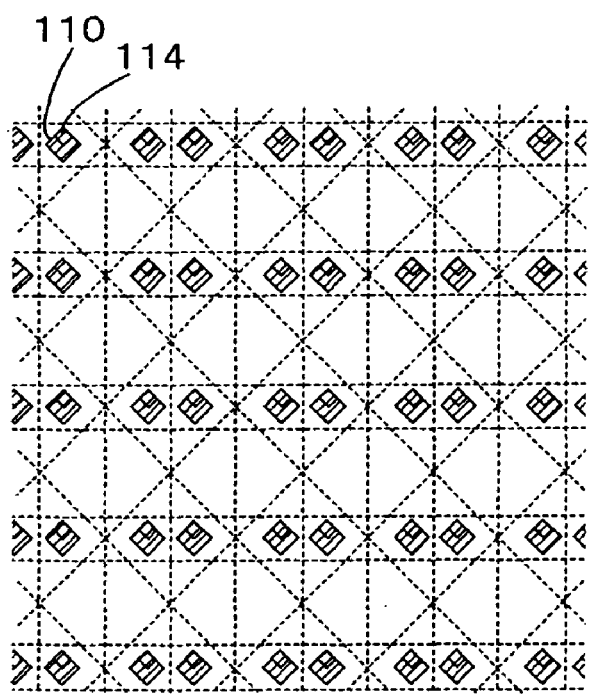
FIG. 13 is one example of the sheets of the submount substrates on which all of the semiconductor light emitting elements are connected by bump connecting.

FIG. 13 is one example of the sheets of the submount substrates on which all of the semiconductor light emitting elements are connected by bump connecting.

In FIG. 13, the semiconductor light emitting elements are indicated by shaded parts, and each broken line indicates positions to be cut by dicing.

Here, as shown in FIG. 13, the semiconductor light emitting elements 110 are mounted on the submount substrates 130 such that the n electrode 114 that is included in a semiconductor light emitting element 110 and is connected to the pad is positioned substantially in the center of a side of the mount area that is connected to the one side, and such that all of the semiconductor light emitting elements 110 face the same direction.

As described above, by making all of the semiconductor light emitting elements 110 face the same direction, it is possible to bond the semiconductor light emitting elements while they face the same direction, when bonding the semiconductor light emitting elements on the sheet by die bonding. Therefore, a mechanism to turn elements needs not to be equipped in a die bonding machine.

Figure 14:
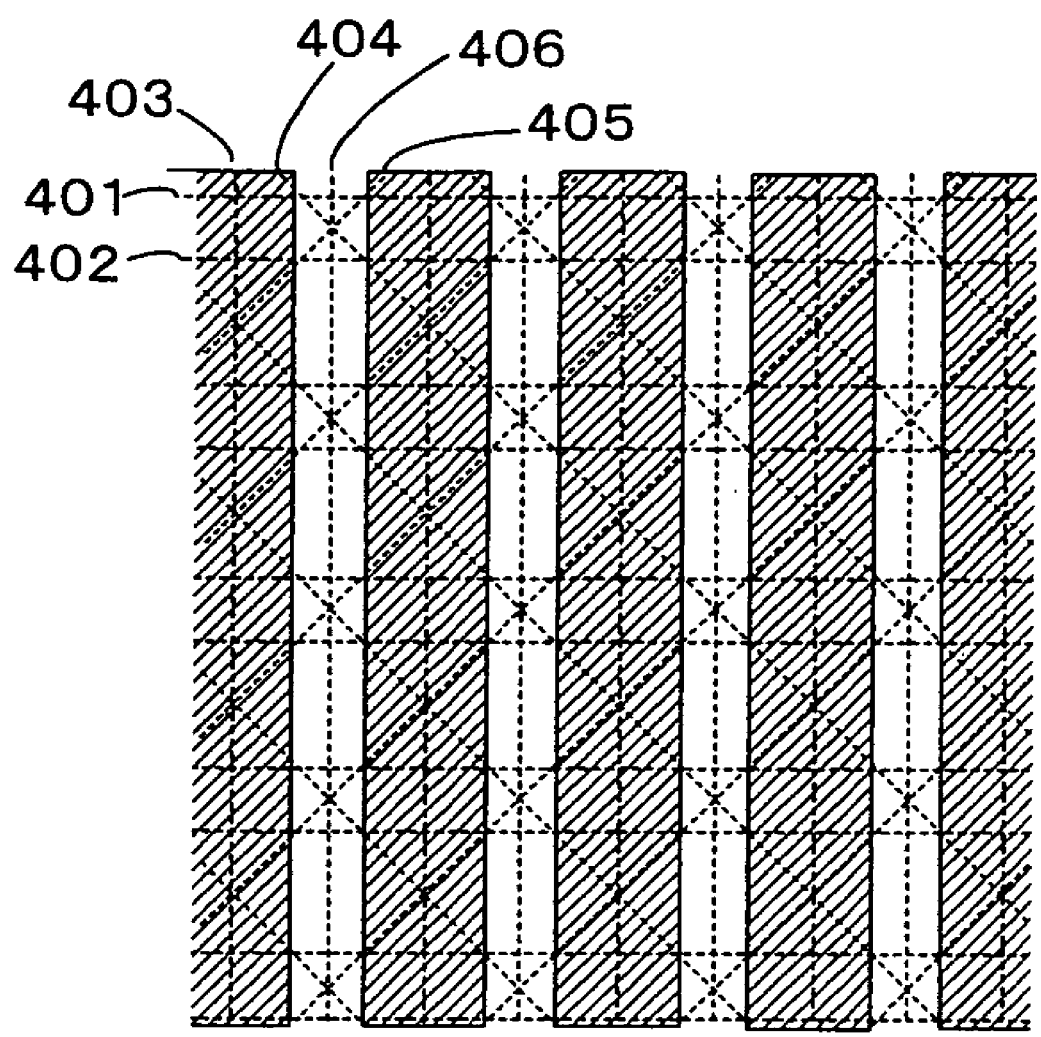
FIG. 14 shows one example of the sheets of submount substrates 130 when the phosphor is applied/printed in an application pattern unique to the present invention.

FIG. 14 shows one example of the sheets of submount substrates 130 when the phosphor is applied/printed in an application pattern unique to the present invention.

In FIG. 14, the phosphors that are applied/printed on the submount substrates 130 are indicated by shaded parts, and each broken line indicates positions to be cut by dicing.

As shown in FIG. 12, with the unique arrangement pattern, a side of the mount area that is opposite to the one side is adjoined by a side of another mount area for another element, with two elements on the mount area and another mount area adjoining back to back, and it is possible to increase the number of substrates that can be cut off from the array substrate. Also, as shown in FIG. 14, when applying/printing the phosphors, the phosphors can be applied/printed collectively to two elements that are adjoining back to back centering on the adjoining sides. Further, it is possible to apply/print the phosphors onto lines together in a vertical direction.

MODIFICATION EXAMPLE 3

The modification example 3 shows other example of the arrangement patterns unique to the present invention described in the first embodiment in a case where the pad area is a triangle.

Figure 15:
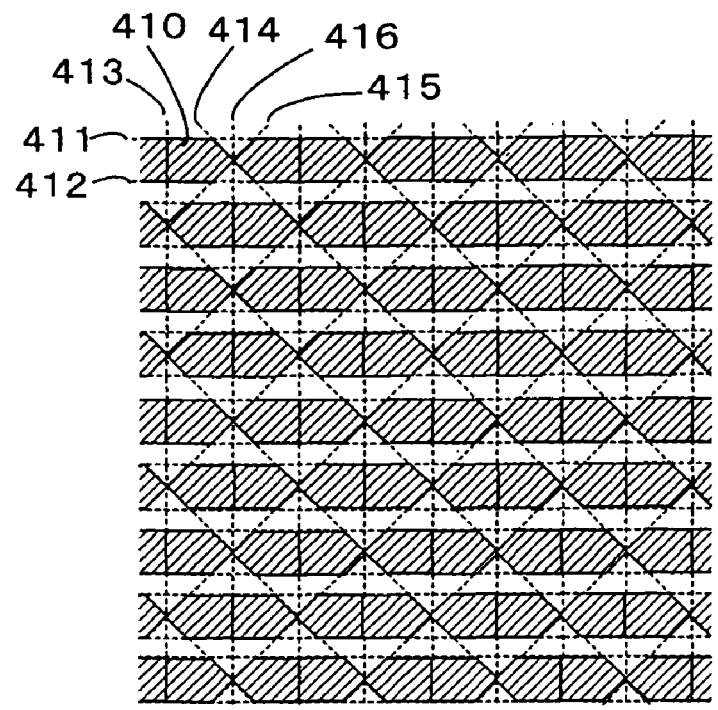
FIG. 15 shows other example of the arrangement patterns unique to the present invention.

FIG. 15 shows other example of the arrangement patterns unique to the present invention.

In the FIG. 15, shaded parts indicate the submount substrates whose pad areas are triangles, and each broken line indicates positions to be cut by dicing. Here, when cutting off a shaded part 410 at the upper left, for example, it is preferable to cut it along the broken lines in the ascending order of the reference numbers, from 411 to 415, because chipping can be prevented by cutting the longer sides first.

Also, in FIG. 15, it is possible to make the pad area trapezoidal by cutting along the broken line 416 with a thick blade.

Figure 16:
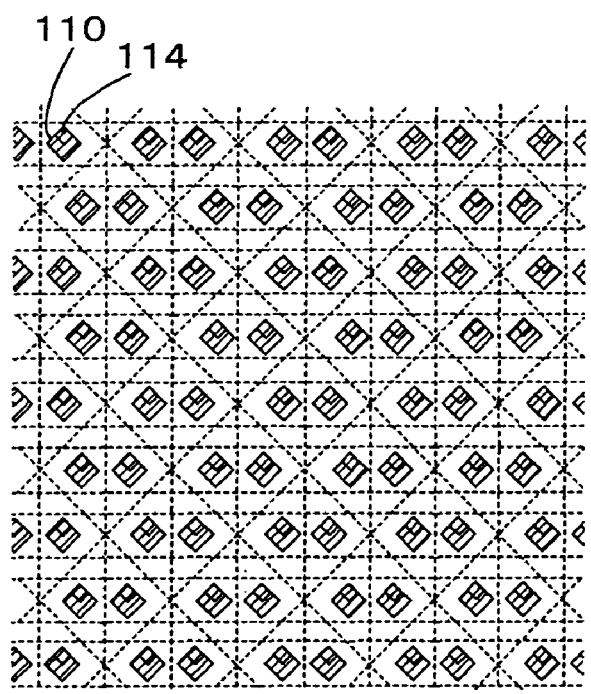
FIG. 16 is other example of the sheets of submount substrates 130 on which all of the semiconductor light emitting elements are connected by bump connecting.

FIG. 16 is other example of the sheets of submount substrates 130 on which all of the semiconductor light emitting elements are connected by bump connecting.

In FIG. 16, the semiconductor light emitting elements 110 are indicated by shaded parts, and each broken line indicates positions to be cut by dicing.

Here, as same as the modification example 2, the semiconductor light emitting elements 110 are mounted on the submount substrates 130 such that the n electrode 114 that is included in the semiconductor light emitting element 110 and is connected to the pad is positioned substantially in the center of a side of the mount area that is connected to the one side, and such that all of the semiconductor light emitting elements 110 face the same direction.

As described above, by making all of the semiconductor light emitting elements face the same direction, it is possible to bond the semiconductor light emitting elements while they face the same direction when bonding the semiconductor light emitting elements on the sheet by die bonding. Therefore, a mechanism to turn elements needs not to be equipped in a die bonding machine.

Figure 17:
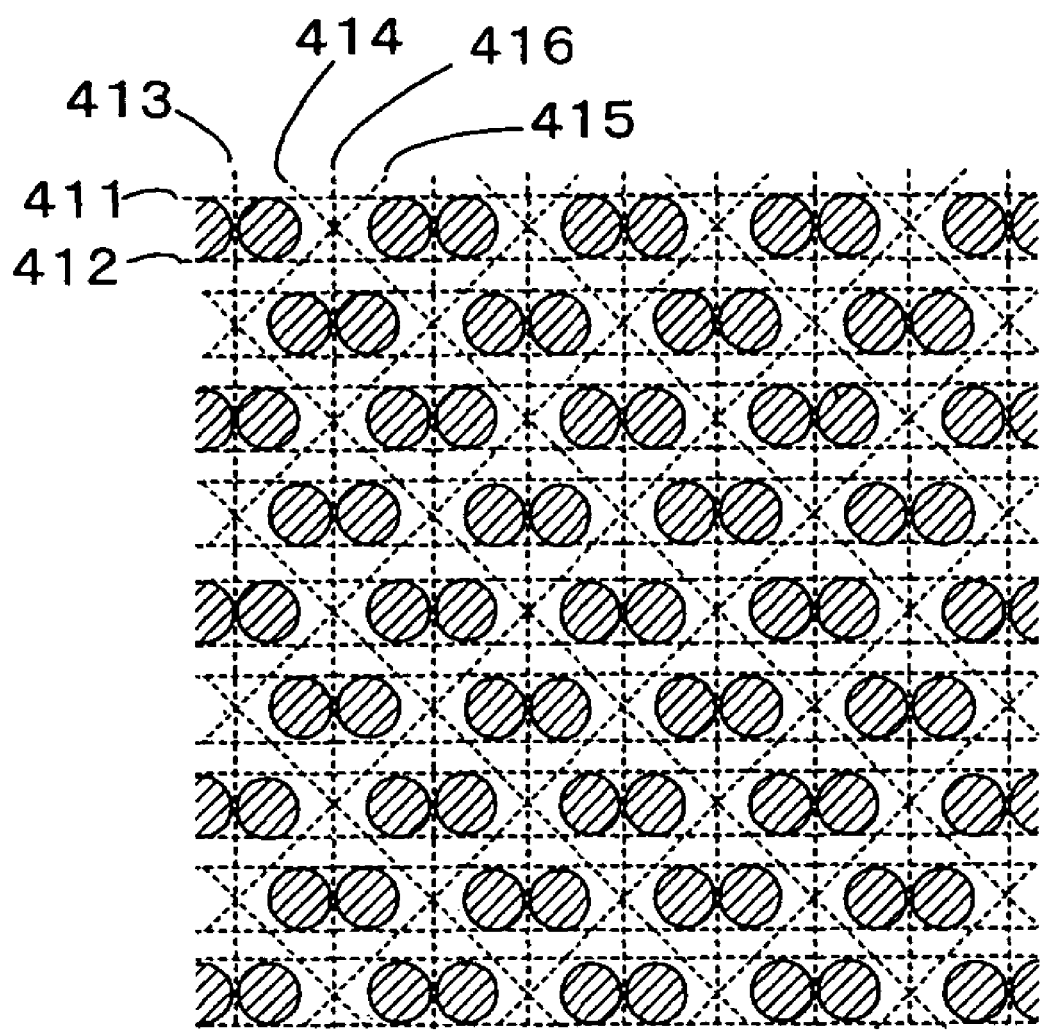
FIG. 17 shows other example of the sheets of the submount substrates 130 when the phosphors are applied/printed in an application pattern unique to the present invention.

FIG. 17 shows other example of the sheets of the submount substrates 130 when the phosphors are applied/printed in an application pattern unique to the present invention.

In FIG. 17, phosphors that are applied/printed on the submount substrates 130 are indicated by shaded parts, and each broken line indicates positions to be cut by dicing.

As shown in FIG. 15, with the unique arrangement pattern, a side of the mount area that is opposite to the one side is adjoined by a side of another mount area for another element, with two elements on the mount area and the another mount area adjoining back to back, and it is possible to increase the number of substrates that can be cut off from the array substrate. Also, when applying/printing the phosphors on the elements, the phosphors can be applied/printed collectively to the two elements that are adjoining back to back centering on the adjoining sides. However, this arrangement pattern is arranged to increase the number of substrates that can be cut off from the array substrate, and it is not possible to apply/print collectively in the longitudinal direction as compared with the arrangement pattern of the modification example 2. Therefore, as shown in FIG. 17, the phosphors are applied/printed to be conical trapezoidal forms.

MODIFICATION EXAMPLE 4

The modification example 4 shows other example of arrangement patterns unique to the present invention described in the first embodiment in a case where the pad area is a triangle.

Figure 18:
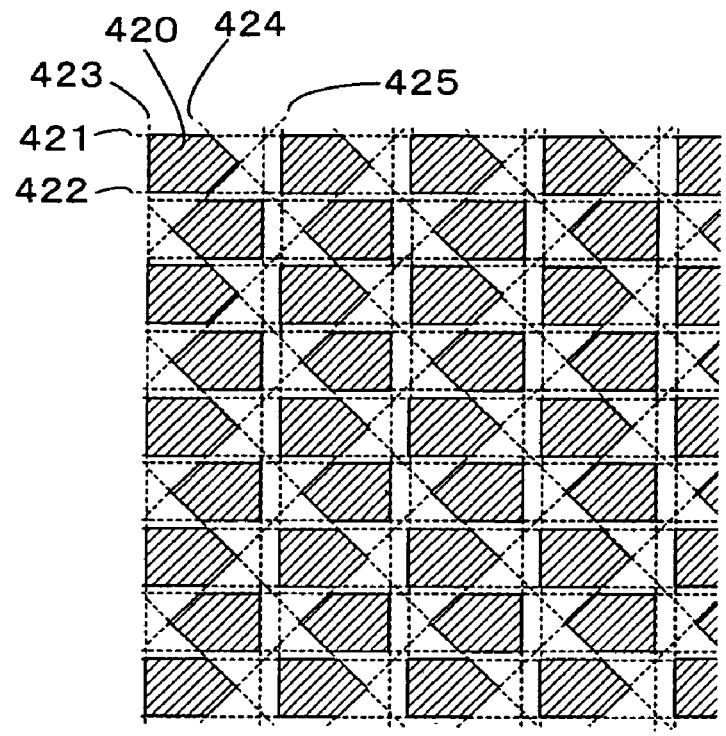
FIG. 18 is other example of the arrangement patterns unique to the present invention.

FIG. 18 is other example of the arrangement patterns unique to the present invention.

In the FIG. 18, shaded parts indicate submount substrates whose pad areas are triangles, and each broken line indicates positions to be cut by dicing. Here, when cutting off a shaded part 420 at the upper left, for example, it is preferable to cut it along the broken lines in the ascending order of the reference number, from 421 to 425, because chipping can be prevented by cutting the longer side first.

Figure 19:
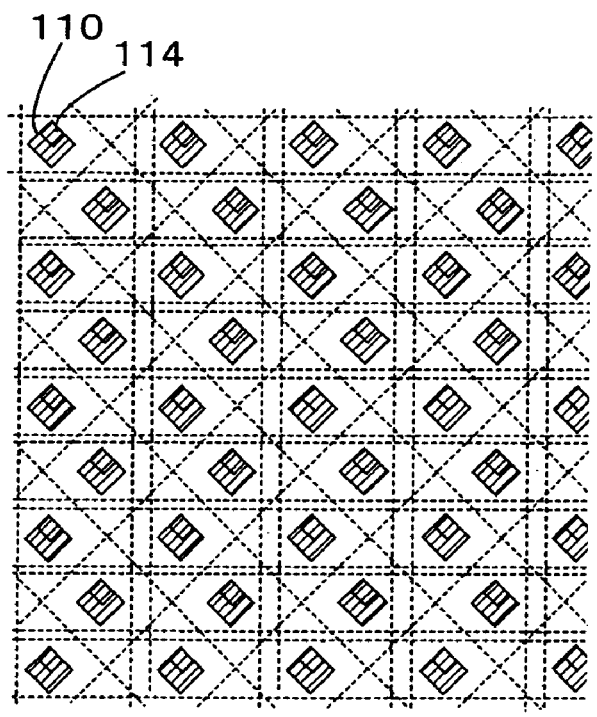
FIG. 19 is other example of the sheets of submount substrates on which all of semiconductor light emitting elements 110 are connected by bump connecting.

FIG. 19 is other example of the sheets of submount substrates on which all of semiconductor light emitting elements 110 are connected by bump connecting.

In FIG. 19, the semiconductor light emitting elements 110 are indicated by shaded parts, and each broken line indicates positions to be cut by dicing.

Here, as same as the modification example 2, the semiconductor light emitting elements 110 are mounted on the submount substrates 130 so that the n electrode 114 that is included in the semiconductor light emitting element 110 and is connected to the pad is positioned substantially in the center of a side of the mount area that is connected to the one side, and such that all of the semiconductor light emitting elements 110 face the same direction.

As described above, by making all of the semiconductor light emitting elements 110 face same direction, it is possible to bond the semiconductor light emitting elements while they face the same direction when bonding semiconductor light emitting elements on the sheet by die bonding. Therefore, a mechanism to turn elements needs not to be equipped in a die bonding machine.

Figure 20:
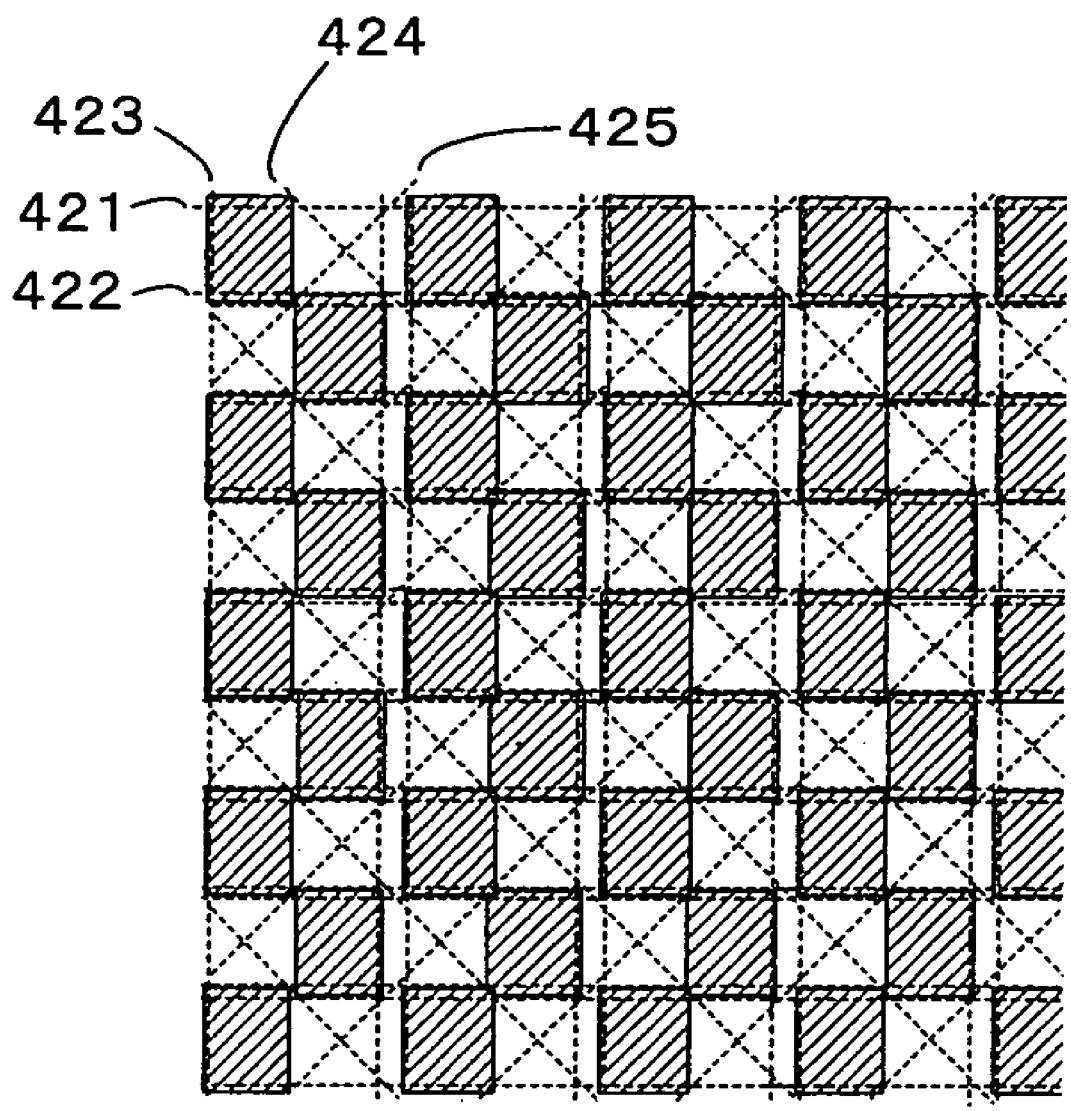
FIG. 20 shows other example of the sheets of submount substrates 130 when the phosphors are applied/printed in an application pattern unique to the present invention.

FIG. 20 shows other example of the sheets of submount substrates 130 when the phosphors are applied/printed in an application pattern unique to the present invention.

In FIG. 20, the phosphors that are applied/printed on the submount substrates 130 are indicated by shaded parts, and each broken line indicates positions to be cut by dicing.

As shown in FIG. 20, in the modification example 4, it is possible to increase the number of substrates that can be cut off from the array substrate. Also, the array substrate of the submount substrates 130 has margins. Therefore, it is possible to control deviation of an application width and to improve productivity.

It should be noted here that means to cut off the submount substrates from the array substrate is not limited to the dicing technique. Any technique such as lasers and sandblastings can be used to cut off the submount substrates. For example, a laser enables to cut in any form. Therefore, a laser can be applied in any case including cases where making the pad area circular arcs or half regular polygons.

INDUSTRIAL APPLICABILITY

The semiconductor light emitting device of the present invention is able to apply to any lighting equipment and display. Especially, it is possible to provide compact and lightweight light sources. Therefore, the semiconductor light emitting device of the present invention has a great deal of potential to install in portable devices such as cellular-phones and cameras.

The invention claimed is:

1. A semiconductor light emitting device comprising:
    a substrate having a main surface comprising (i) a mount area that is rectangular and (ii) a pad area having a pad for wire bonding; and
    an element that emits light mounted on the mount area of the substrate, wherein
    the pad area is contiguous to the mount area on only one side of the mount area,
    the pad area decreases in width continuously or stepwise in a direction away from the one side,
    an outline of the pad area includes one or more bent portions and/or one or more arc portions that protrude only in the direction away from the one side,
    the one side is at a boundary between the mount area and the pad area, and
    an outline of an entirety of the mount area and the pad area combined together coincides with an outline of the substrate from a plan view of the substrate.

2. The semiconductor light emitting device of claim 1, wherein the pad area is an isosceles trapezoid whose long base coincides with the one side.

3. The semiconductor light emitting device of claim 1, wherein the pad area is an isosceles triangle whose base coincides with the one side.

4. The semiconductor light emitting device of claim 1, wherein the pad area is a circular arc whose chord coincides with the one side.

5. The semiconductor light emitting device of claim 1, wherein the pad area is a half regular polygon obtained by dividing a regular polygon by a symmetrical line, and a longest side of the half regular polygon coincides with the one side.

6. The semiconductor light emitting device of claim 1, further comprising:
    a phosphor that changes a wavelength of the light emitted by the element, wherein
    the element is mounted substantially in the center of the mount area, and
    the mount area and the element are covered by the phosphor.

7. The semiconductor light emitting device of claim 1, wherein
    the element includes an electrode that is connected to the pad and is positioned substantially in a center of one of two sides of the mount area that are connected to the one side.

8. The semiconductor light emitting device of claim 1, further comprising:
    a cup-like reflection member that reflects the light emitted in parallel with the main surface by the element so that the light travels in a direction perpendicular to the main surface, wherein
    a center of a main light emitting surface of the element coincides with a center of the reflection member.

9. The semiconductor light emitting device of claim 1, further comprising:
    a lens that outputs the light emitted by the element toward an object, wherein
    the center of a main light emitting surface of the element coincides with an optical center of the lens.

10. The semiconductor light emitting device of claim 1, wherein the pad decreases in width as the pad area decreases in width.

11. The semiconductor light emitting device of claim 1, wherein
    a thickness of a part of the substrate that corresponds to the mount area is equal to a thickness of the part of the substrate that corresponds to the pad area.

12. The semiconductor light emitting device of claim 11, wherein
    on a border between the part of the substrate that corresponds to the mount area and the part of the substrate that corresponds to the pad area, a width of the substrate that corresponds to the mount area is equal to a width of the part of the substrate that corresponds to the pad area.

13. The semiconductor light emitting device of claim 1, wherein
    first and second electrodes are arranged on a main element surface of the element,
    the element is mounted on the mount area in such a manner that the main element surface opposes the substrate,
    first and second counter electrodes are arranged on the substrate so as to oppose the first and second electrodes, respectively,
    the first counter electrode is in an area including a part of the mount area and a part of the pad area,
    a part of the first counter electrode on the part of the mount area is electrically connected to the first electrode, and a part of the first counter electrode on the part of the pad area functions as the pad, and
    the second counter electrode is on the mount area and electrically connected to the second electrode.

14. The semiconductor light emitting device of claim 13, wherein
    a back-side electrode is arranged on a back surface of the substrate, and
    the back-side electrode is electrically connected to the second counter electrode and a terminal that is outside the semiconductor light emitting device.

* * * * *